(12) United States Patent
Chun et al.

(10) Patent No.: US 10,784,212 B2
(45) Date of Patent: Sep. 22, 2020

(54) SEMICONDUCTOR DEVICES HAVING CRACK-INHIBITING STRUCTURES

(71) Applicant: Micron Technology, Inc., Boise, ID (US)

(72) Inventors: Hyunsuk Chun, Boise, ID (US); Sheng Wei Yang, Boise, ID (US); Shams U. Arifeen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/236,167

(22) Filed: Dec. 28, 2018

(65) Prior Publication Data

US 2020/0211983 A1 Jul. 2, 2020

(51) Int. Cl.
*H01L 23/00* (2006.01)
*H01L 23/532* (2006.01)
*H01L 23/58* (2006.01)
*H01L 21/768* (2006.01)
*H01L 23/498* (2006.01)

(52) U.S. Cl.
CPC ........ *H01L 23/562* (2013.01); *H01L 21/7682* (2013.01); *H01L 23/49827* (2013.01); *H01L 23/5329* (2013.01); *H01L 23/585* (2013.01); *H01L 24/05* (2013.01); *H01L 2224/02235* (2013.01)

(58) Field of Classification Search
CPC ..... H01L 51/56; H01L 33/62; H01L 51/0072; H01L 51/5012; H01L 51/5056
USPC .......................................................... 257/692
See application file for complete search history.

(56) References Cited

U.S. PATENT DOCUMENTS

| 5,736,791 | A | 4/1998 | Fujiki et al. | |
| 2005/0230847 | A1* | 10/2005 | Lee | H01L 23/60 257/782 |
| 2010/0224966 | A1* | 9/2010 | Chen | H01L 23/3121 257/621 |
| 2018/0269161 | A1* | 9/2018 | Wu | H01L 23/562 |

* cited by examiner

*Primary Examiner* — Andy Huynh
(74) *Attorney, Agent, or Firm* — Perkins Coie LLP

(57) ABSTRACT

Semiconductor devices having metallization structures including crack-inhibiting structures, and associated systems and methods, are disclosed herein. In one embodiment, a semiconductor device includes a metallization structure formed over a semiconductor substrate. The metallization structure can include a bond pad electrically coupled to the semiconductor substrate via one or more layers of conductive material, and an insulating material—such as a low-κ dielectric material—at least partially around the conductive material. The metallization structure can further include a crack-inhibiting structure positioned beneath the bond pad between the bond pad and the semiconductor substrate. The crack-inhibiting structure can include a barrier member extending vertically from the bond pad toward the semiconductor substrate and configured to inhibit crack propagation through the insulating material.

22 Claims, 7 Drawing Sheets

SEMICONDUCTOR DEVICES HAVING CRACK-INHIBITING STRUCTURES

CROSS-REFERENCE TO RELATED APPLICATION

This application contains subject matter related to a concurrently-filed U.S. Patent Application, titled "SEMICONDUCTOR PACKAGES HAVING CRACK-INHIBITING STRUCTURES." The related application Ser. No. 16/236,143, of which the disclosure is incorporated by reference herein, is assigned to Micron Technology, Inc.

TECHNICAL FIELD

The present technology generally relates to semiconductor devices having crack-inhibiting structures, and more particularly relates to semiconductor devices having ring-type via structures formed beneath bonds pads thereof.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

In some semiconductor packages, the bond pads of a semiconductor die can be electrically coupled to a substrate via a thermo-compression bonding operation in which conductive pillars are formed on the bond pads and coupled to the substrate via a bond material that is disposed between the conductive pillars and the substrate. To attach the bond material to the substrate, the semiconductor package is heated to heat and reflow the bond material. However, heating the semiconductor package and/or subsequently cooling the semiconductor package can induce significant mechanical stress between the semiconductor die and the substrate due to a mismatch in the coefficients of thermal expansion of these components. Often, the stress can induce cracking of the semiconductor die near one or more of the bond pads, which can render the semiconductor package inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
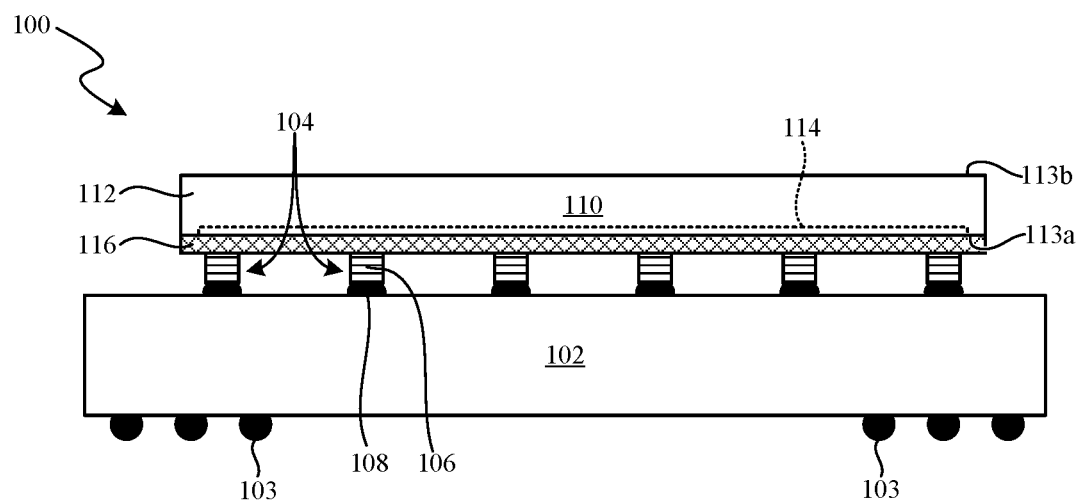
FIGS. 1A and 1B are side cross-sectional views of a semiconductor package at various stages in a method of manufacture in accordance with embodiments of the present technology.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-7.

In several of the embodiments described below, a semiconductor device can include a semiconductor substrate including circuit elements, and a metallization structure (e.g., a back end of line (BEOL) structure) formed at least partially over the substrate. The metallization structure can include bond pads electrically coupled to the circuit elements. More particularly, the metallization structure can include one or more layers of conductive material electrically coupling the bond pads to the circuit elements and one or more layers of insulating material at least partially surrounding the conductive material. In some embodiments, the insulating material comprises a mechanically fragile material, such as a low-κ dielectric material, that can be susceptible to cracking or other mechanical and/or electrical failure due to mechanical stresses—for example, thermo-mechanical stresses induced by directly attaching the semiconductor device to a package substrate. Accordingly, the metallization structure can further include crack-inhibiting structures positioned beneath some or all of the bond pads and configured to inhibit or retard the propagation of cracks through the insulating material. In some embodiments, the crack-inhibiting structures include (i) a metal layer extending generally parallel to a corresponding bond pad and (ii) a barrier member extending vertically between the metal layer and the corresponding bond pad. In some embodiments, the barrier member is a wall of metal that is formed into a ring-like shape. The crack-inhibiting structures can reduce the likelihood of mechanical failure around the bond pads after, for example, a thermo-compression bonding (TCB) operation is carried out to secure the bond pads of the semiconductor device to a package substrate.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-7. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
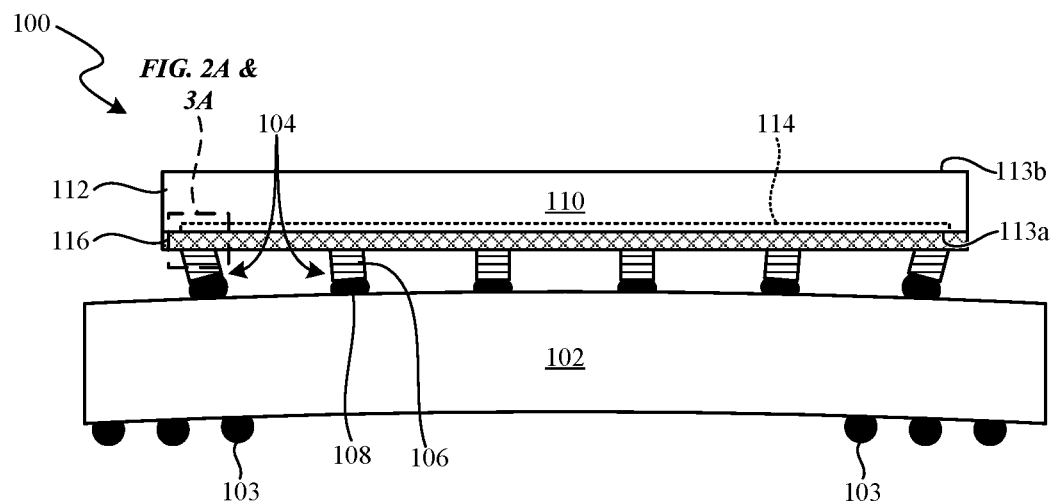

FIGS. 1A and 1B are side cross-sectional views of a semiconductor package 100 ("package 100") at various stages in a method of manufacture in accordance with embodiments of the present technology. More particularly, FIGS. 1A and 1B illustrate the package 100 at the beginning and end, respectively, of a thermo-compression bonding (TCB) operation. Referring to FIGS. 1A and 1B together, the package 100 can include a semiconductor die 110 carried by a package substrate 102 and electrically coupled to the package substrate 102 via a plurality of interconnects 104.

In the illustrated embodiment, the semiconductor die 110 includes a semiconductor substrate 112 (e.g., a silicon substrate, a gallium arsenide substrate, an organic laminate substrate, etc.) having a first side/surface 113a and a second side/surface 113b opposite the first side 113a. The first side 113a of the semiconductor substrate 112 can be an active side including one or more circuit elements 114 (e.g., wires, traces, interconnects, transistors, etc.; shown schematically) formed in and/or on the first side 113a. The circuit elements 114 can include, for example, memory circuits (e.g., dynamic random memory (DRAM) or other type of memory circuits), controller circuits (e.g., DRAM controller circuits), logic circuits, and/or other circuits. In other embodiments, the semiconductor substrate 112 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials. In the illustrated embodiment, the semiconductor die 110 further includes a metallization structure 116 formed over at least a portion of the first side 113a of the semiconductor substrate 112. As described in greater detail below with reference to FIG. 2A, the metallization structure 116 can include one or more dielectric layers, metal layers, interconnects, vias, etc., and is configured to electrically couple the circuit elements 114 to the interconnects 104.

The package substrate 102 can include a redistribution layer, an interposer, a printed circuit board, a dielectric spacer, another semiconductor die (e.g., a logic die), or another suitable substrate. The package substrate 102 can further include electrical connectors 103 (e.g., solder balls, conductive bumps, conductive pillars, conductive epoxies, and/or other suitable electrically conductive elements) electrically coupled to the package substrate 102 and configured to electrically couple the package 100 to external devices or circuitry (not shown).

In the illustrated embodiment, the first side 113a of the semiconductor substrate 112 faces the package substrate 102 (e.g., in a direct chip attach (DCA) configuration). In other embodiments, the semiconductor die 110 can be arranged differently. For example, the second side 113b of the semiconductor substrate 112 can face the package substrate 102 and the semiconductor die 110 can include one or more TSVs extending through the semiconductor substrate 112 to electrically couple the circuit elements 114 to the interconnects 104. Moreover, while only a single semiconductor die 110 is shown in FIGS. 1A and 1B, in other embodiments the package 100 can include one or more additional semiconductor dies stacked on and/or over the semiconductor die 110.

In the illustrated embodiment, individual ones of the interconnects include (i) a first conductive feature (e.g., a conductive pillar 106) electrically connected to the metallization structure 116 of the semiconductor die 110 and (ii) a bond material 108 formed between the conductive pillar 106 and the package substrate 102. In some embodiments, second conductive features (e.g., conductive pads) can be formed on the package substrate 102, and the bond material 108 can be formed between the second conductive features and the conductive pillars 106. The conductive pillars 106 can be formed of any suitably conductive material such as, for example, copper, nickel, gold, silicon, tungsten, conductive-epoxy, combinations thereof, etc., and can be formed from using an electroplating, electroless-plating, or other suitable process. In some embodiments, the interconnects 104 can also include barrier materials (not shown; e.g., nickel, nickel-based intermetallic, and/or gold) formed over end portions of the conductive pillars 106. The barrier materials can facilitate bonding and/or prevent or at least inhibit the electromigration of copper or other metals used to form the conductive pillars 106. While six interconnects 104 are illustrated in FIGS. 1A and 1B, the package 100 can include a smaller or greater number of interconnects 104. For example, the package 100 can include tens, hundreds, thousands, or more interconnects 104 arrayed between the semiconductor die 110 and the package substrate 102.

In some embodiments, the package 100 can further include an underfill or molded material formed over the package substrate 102 and/or at least partially around the semiconductor die 110. In some embodiments, the package 100 can include other components such as external heatsinks, a casing (e.g., thermally conductive casing), electromagnetic interference (EMI) shielding components, etc.

In FIG. 1A, the package 100 is illustrated at the beginning of the TCB operation, in which heating has caused the bond material 108 in the interconnects 104 to reflow and electrically connect the conductive pillars 106 to the package substrate 102. In some embodiments, the package 100 can be heated to 200° C. or greater (e.g., greater than about 217° C.) to reflow the bond material 108. During the TCB operation, a compressive force is applied to secure the interconnects 104 to the package substrate 102. In FIG. 1B, the package 100 is illustrated at the completion of the TCB operation, after the compressive force has been applied and after cooling the package 100 (e.g., to about 25° C.). By cooling the package 100 at this point, the bond material 108 can be solidified, securing the semiconductor die 110 to the package substrate 102.

As shown in FIG. 1B, one drawback with the illustrated TCB operation is that cooling of the package 100 can cause the semiconductor die 110 and the package substrate 102 to warp or bend relative to one another, which can introduce mechanical (e.g., thermomechanical) stresses into the package 100 (e.g., chip-package interaction (CPI) stresses). For example, the semiconductor die 110 can have a coefficient of thermal expansion (CTE) that is different than a CTE of the package substrate 102, and the CTE mismatch between these components can cause them to warp relative to one another during cooling and/or heating of the package 100. In some embodiments, the CTE of the semiconductor die 110 is lower than the CTE of the package substrate 102. Accordingly, as shown in FIG. 1B, the package substrate 102 can have a warped, non-planar shape after cooling. In other embodiments, the semiconductor die 110 or both the semiconductor die 110 and the package substrate 102 can have a non-planar, warped shape after cooling. As further shown in FIG. 1B, the CTE mismatch between the semiconductor die 110 and the package substrate 102 can laterally stress and bend the interconnects 104. This can cause cracks to form and propagate within the metallization structure 116, which can cause mechanical and/or electrical failures within the package 100.

Figure 2A:
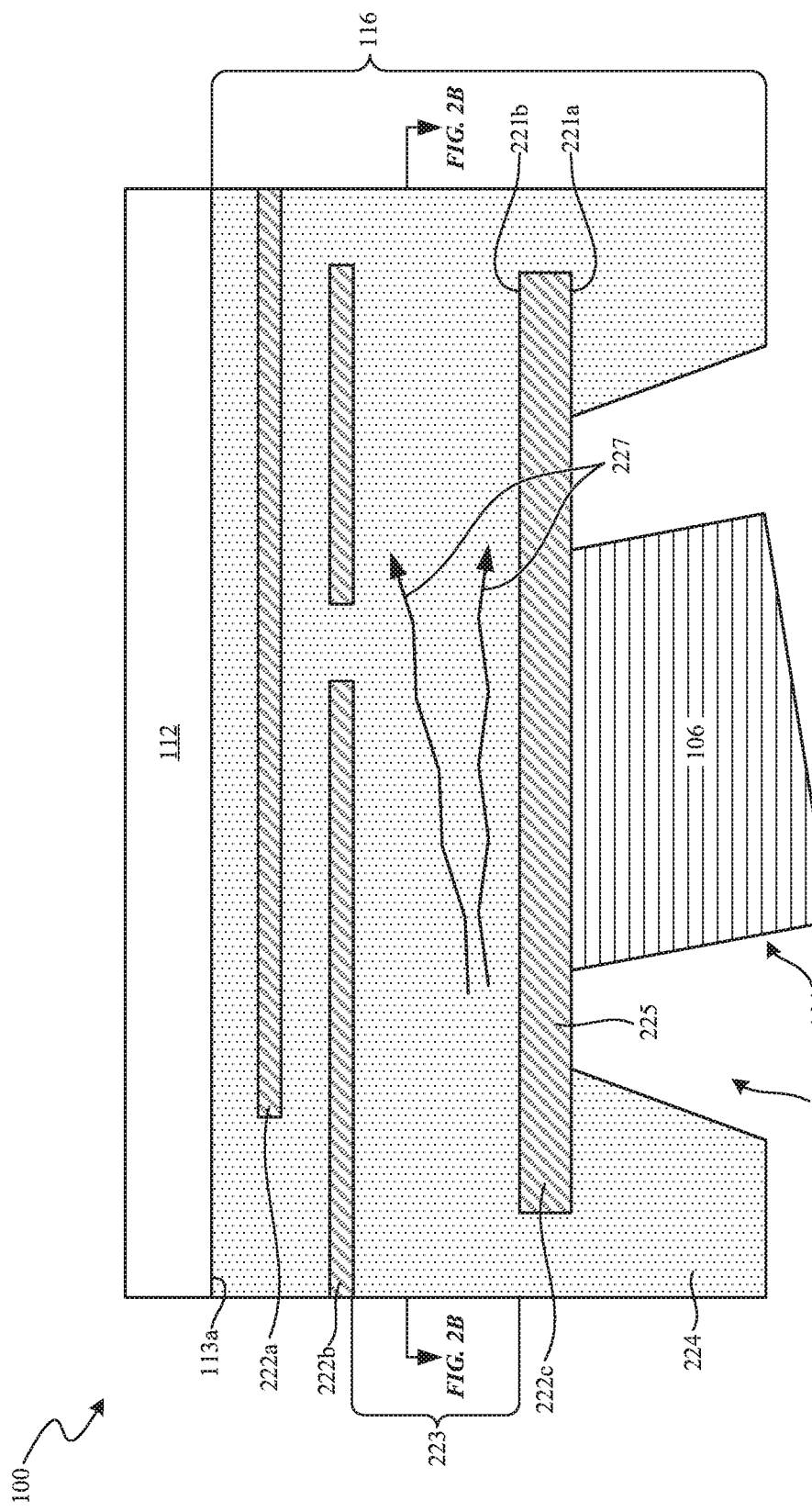
FIG. 2A is an enlarged, side cross-sectional view of a portion of the semiconductor package shown in FIGS. 1A and 1B and having a metallization structure configured in accordance with the prior art.

More particularly, FIG. 2A is an enlarged, side cross-sectional view of a portion of the package 100 shown in FIGS. 1A and 1B configured in accordance with the prior art. As shown in FIG. 2A, the metallization structure 116 includes a plurality of conductive layers 222 (e.g., metallization layers; individually labeled as first through third conductive layers 222a-222c) that are at least partially surrounded by an insulating material 224. In general, the metallization structure 116 can be formed as part of a back end of line (BEOL) fabrication process as is known in the art. For example, the insulating material 224 can include a plurality of layers, and the layers of the insulating material 224 and the conductive layers 222 can be additively built (e.g., disposed) upon the active first side 113a of the semiconductor substrate 112. The conductive layers 222 can be formed from electrically conductive materials such as, for example, copper, tungsten, aluminum, gold, titanium nitride, tantalum, etc., and can include more or fewer than the three layers illustrated in FIG. 2A (e.g., two layers, four layers, five layers, more than five layers, etc.). The conductive layers 222 are configured to couple the circuit elements 114 (FIGS. 1A and 1B) to corresponding ones of the interconnects 104. In the illustrated embodiment, for example, the third conductive layer 222c can have a first surface 221a (opposite a second surface 221b) that is at least partially exposed from the insulating material 224 at an opening 226 therein, and that defines a bond pad 225 of the semiconductor die 110. The conductive pillar 106 of the illustrated one of the interconnects 104 is attached and electrically coupled to the first surface 221a of the bond pad 225.

The insulating material 224 can comprise one or more layers of the same or different passivation, dielectric, or other suitable insulating material. For example, the insulating material 224 can comprise silicon oxide, silicon nitride, poly-silicon nitride, poly-silicon oxide, tetraethyl orthosilicate (TEOS), etc. In some embodiments, the insulating material 224 can at least partially comprise a dielectric material with a small dielectric constant relative to silicon oxide (a "low-κ dielectric material"). Such low-κ dielectric materials can include fluorine-doped silicon dioxide, carbon-doped silicon dioxide, porous silicon dioxide, organic polymeric dielectrics, silicon based polymeric dielectrics, etc. Notably, low-κ dielectric materials can increase the performance of the package 100, but can be mechanically fragile compared to conventional (e.g., higher-κ) dielectric materials.

Accordingly, the insulating material 224 can be relatively more prone to mechanical failure (e.g., cracking, delamination, etc.) due to the mechanical stresses induced by warping of the package 100 than other portions/components of the package 100. For example, as shown in FIG. 2A, the insulating material 224 can include a region 223 that is most susceptible to stress-induced mechanical failure. The region 223 (i) is directly adjacent to the bond pad 225 and (ii) extends between and electrically isolates the bond pad 225 and the second conductive layer 222b. Therefore, the metallization structure 116 does not include any conductive structure, such as a vertically-extending via, that is electrically coupled to the bond pad 225 directly beneath the bond pad 225 (e.g., beneath the bond pad 225 between the bond pad 225 and the semiconductor substrate 112) and that may provide additional mechanical strength in the region 223.

Figure 2B:
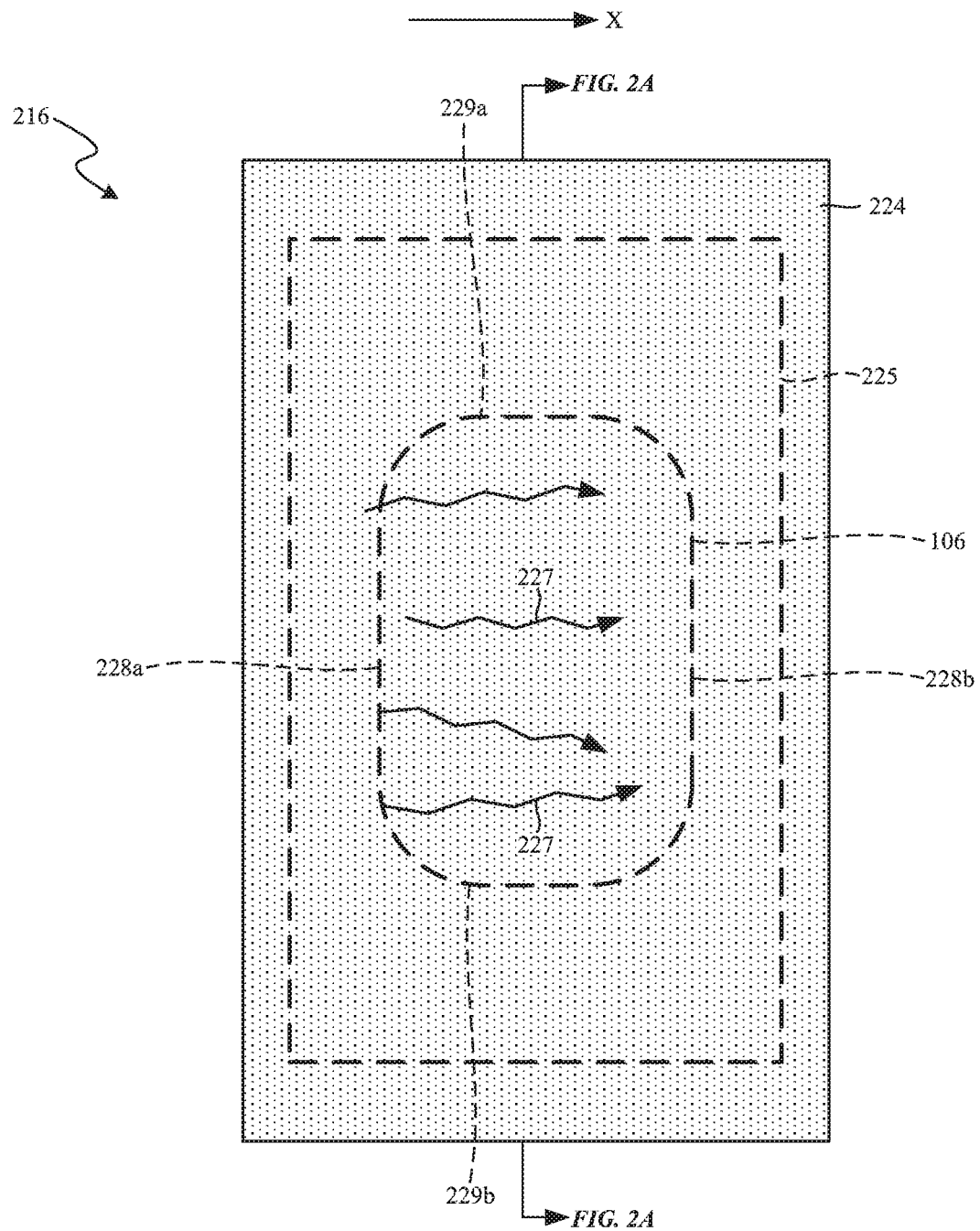
FIG. 2B is a bottom cross-sectional view of the portion of the semiconductor package shown in FIG. 2A configured in accordance with the prior art.

FIG. 2B is a top cross-sectional view of the portion of the package 100 shown in FIG. 2A taken through the region 223 of the insulating material 224. The footprints of the bond pad 225 and the conductive pillar 106 are shown schematically in FIG. 2B. As shown, the conductive pillar 106 can have a generally oblong cross-sectional shape including (i) opposing first and second side portions 228a and 228b and (ii) opposing third and fourth side portions 229a and 229b. In other embodiments, the conductive pillar 106 can have other cross-sectional shapes such as, for example, rectilinear, polygonal, circular, irregular, etc. Referring to FIGS. 2A and 2B together, the conductive pillar 106 is stressed, bent, slanted, warped, etc., in a direction indicated by arrow X (e.g., in a direction generally from the first side portion 228a toward the second side portion 228b). Accordingly, the conductive pillar 106 can impart (i) a relatively high tensile stress on the metallization structure 116 (e.g., on the bond pad 225 and the insulating material 224) beneath the first side portion 228a and (ii) a relatively high compressive stress beneath the second side portion 228b.

The mechanical stresses induced by the conductive pillar 106 can causes cracks to form in the relatively mechanically weak insulating material 224 in, for example, the region 223 that is directly adjacent to the bond pad 225 and therefore subject to the greatest stresses. For example, as shown in FIGS. 2A and 2B, one or more cracks 227 can propagate through the insulating material 224. It is expected that any of the cracks 227 will generally (i) originate in the insulating material 224 at or near the first side portion 228a (e.g., laterally outside or within the footprint of the conductive pillar 106 near the first side portion 228a) and (ii) propagate laterally in the direction indicated by arrow X from proximate the first side portion 228a (e.g., a region of high tensile stress) toward the second side portion 228b (e.g., a region of high compressive stress). Moreover, it is expected that any of the cracks 227 can extend vertically toward, into, and/or past the conductive layers 222a, b. As one of skill in the art will understand, however, the particular stresses imparted on the metallization structure 116, and the propagation pattern of any resulting cracks, will depend on the specific configurations (e.g., dimensions, shapes, material composition, etc.) of the conductive pillar 106 and the metallization structure 116. In some embodiments, for example, cracks may propagate in a direction that generally extends between the third and fourth side portions 229a, b, and/or in a direction from the second side portion 228b toward the first side portion 228a. Cracking of the insulating material 224 can cause mechanical and/or electrical failure of the semiconductor die 110—rendering the package fully or partially inoperable. In some instances, for example, the conductive pillar 106 can fully or partially rip out of the metallization structure 116.

Figure 3A:
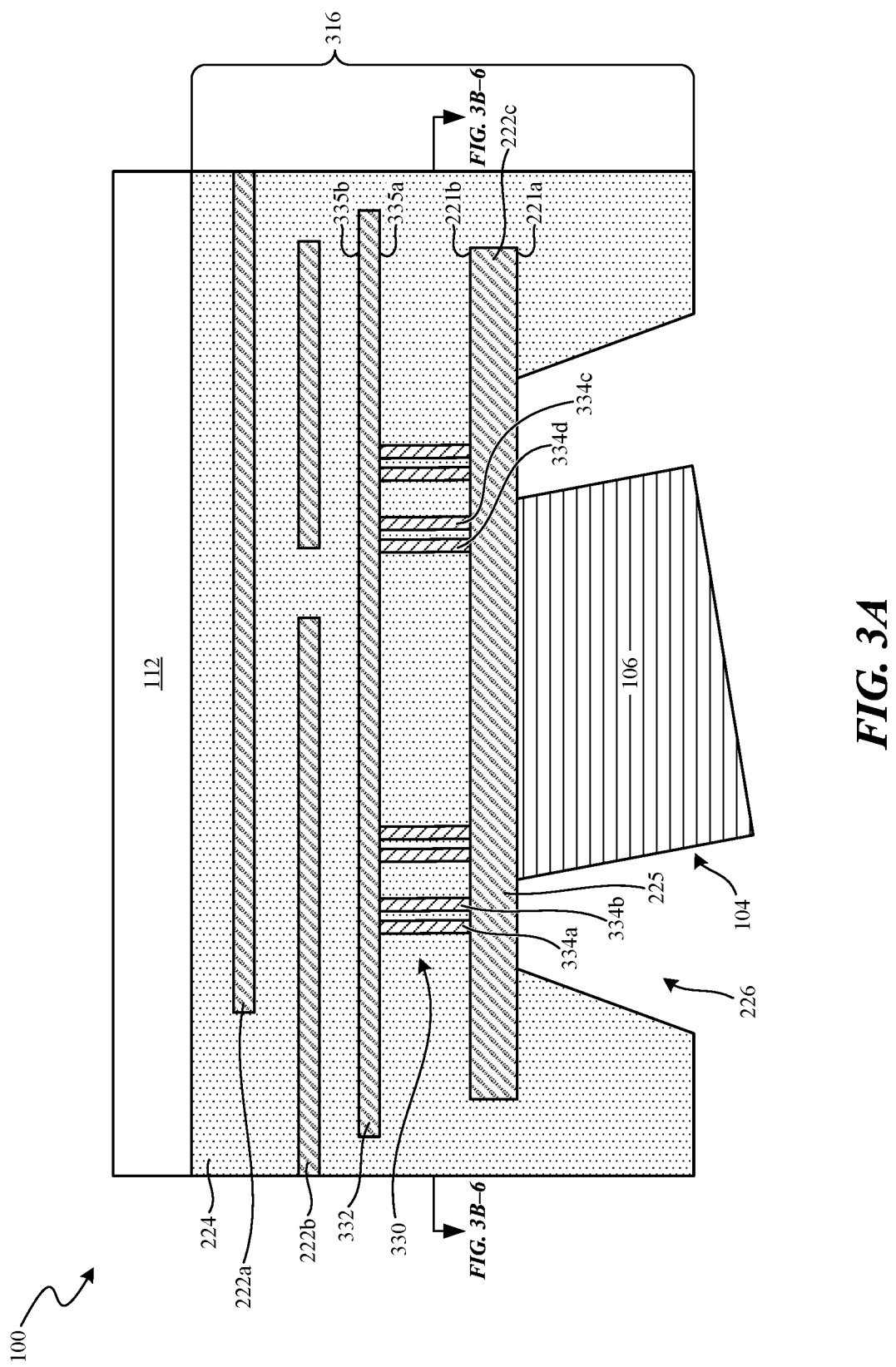
FIG. 3A is an enlarged, side cross-sectional view of a portion of the semiconductor package shown in FIGS. 1A and 1B and having a metallization structure configured in accordance with an embodiment of the present technology.

FIG. 3A is an enlarged, side cross-sectional view of a portion of the package 100 shown in FIGS. 1A and 1B and having a metallization structure 316 configured in accordance with an embodiment of the present technology. The metallization structure 316 can include features generally similar to the metallization structure 116 described in detail above with reference to FIGS. 1A-2B. For example, the metallization structure 316 includes the conductive layers 222 and the insulating material 224. Likewise, the third conductive layer 222c is partially exposed in the opening 226 of the insulating material 224 and defines the bond pad 225. In the illustrated embodiment, however, the metallization structure 316 further includes a crack-blocking or crack-inhibiting structure 330 ("structure 330") positioned beneath the bond pad 225 between the bond pad 225 and the semiconductor substrate 112. In the illustrated embodiment, the structure 330 includes (i) a conductive (e.g., metal) layer 332 and (ii) a plurality of barrier walls or members 334 (individually labeled as first through fourth barrier members 334a-334d). The structure 330 is configured to inhibit, block, and/or retard propagation of cracks through the insulating material 224.

Figure 3B:
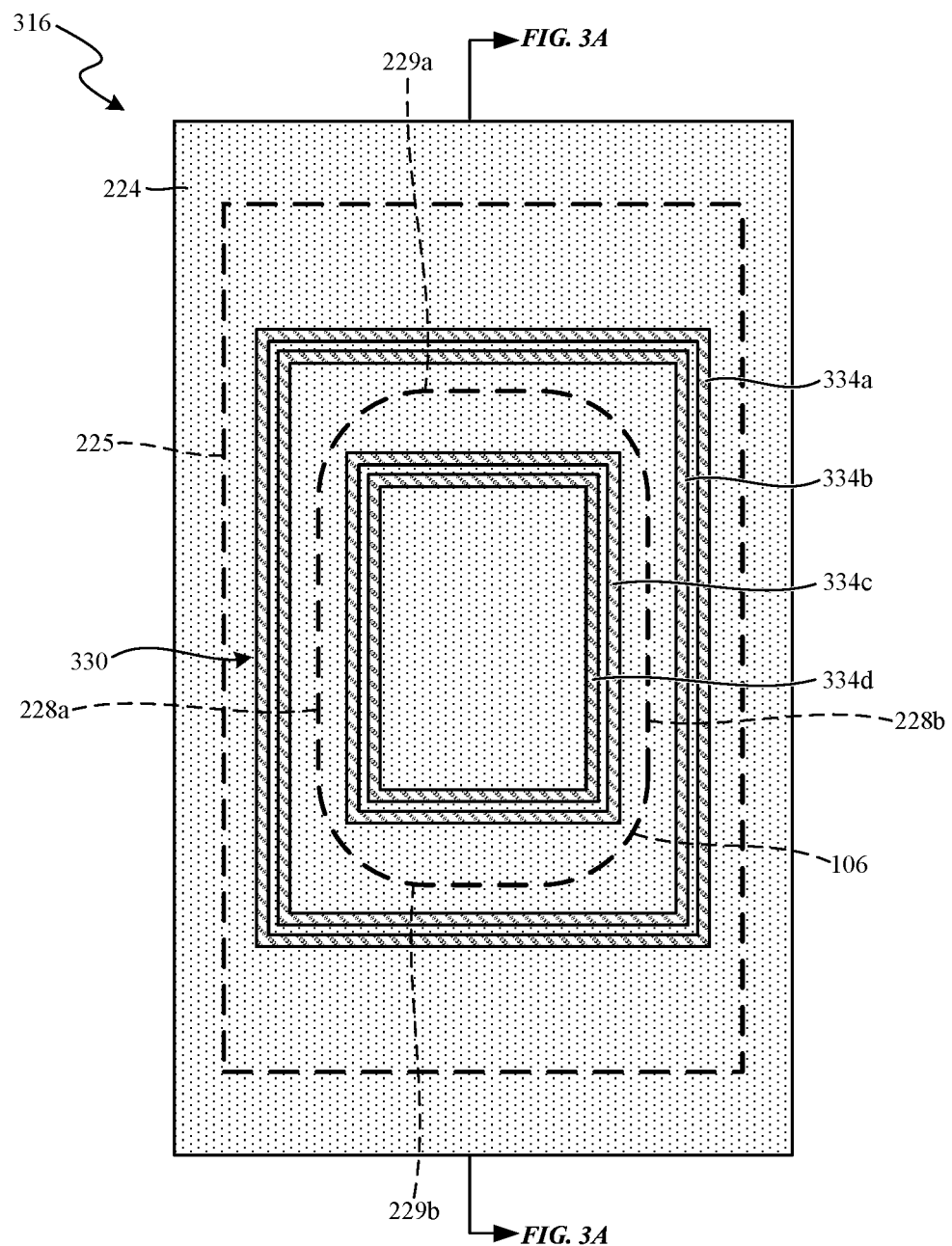
FIG. 3B is a bottom cross-sectional view of the portion of the semiconductor package shown in FIG. 3A configured in accordance with an embodiment of the present technology.

FIG. 3B is a bottom cross-sectional view of the portion of the package 100 shown in FIG. 3A. The footprints of the bond pad 225 and the conductive pillar 106 are shown schematically in FIG. 3B. Referring to FIGS. 3A and 3B together, the conductive layer 332 extends laterally between the semiconductor substrate 112 and the bond pad 225 and includes a first surface 335a facing the second surface 221b of the bond pad 225, and a second surface 335b opposite the first surface 335a. Therefore, in some embodiments, the conductive layer 332 is positioned beneath the bond pad 225 and generally parallel to the bond pad 225. In some embodiments, the bond pad 225 and the conductive layer 332 have substantially the same planform shape. In the illustrated embodiment, the conductive layer 332 has a greater width than the bond pad 225 such that it extends laterally beyond the bond pad 225. In other embodiments, the bond pad 225 and conductive layer 332 can have the same dimensions such that the bond pad 225 is superimposed over the conductive layer 332. In yet other embodiments, the conductive layer 332 can be entirely within a footprint of (e.g., entirely beneath) the bond pad 225.

In some embodiments, the conductive layer 332 can be formed as part of or an extension of the same BEOL fabrication process used to manufacture the conductive layers 222. Accordingly, the conductive layer 332 can be generally similar to the conductive layers 222 and can comprise copper, tungsten, aluminum, gold, titanium nitride, tantalum, etc. In certain embodiments, the conductive layer 332 is electrically isolated from the circuit elements 114 (FIGS. 1A and 1B) of the package 100. That is, the conductive layer 332 can be formed as an "island" of conductive material that provides added mechanical strength beneath the bond pad 225 without serving any electrical routing function. Accordingly, in some embodiments, the structure 330 is not electrically coupled to any of the circuit elements 114, and the bond pad 225 can be electrically coupled to one or more of the circuit elements 114 (FIGS. 1A and 1B) via an electrical path that does not include the structure 330.

Referring to FIG. 3A, the barrier members 334 each extend vertically between the first surface 335a of the conductive layer 332 and the second surface 221b of the bond pad 225. In some embodiments, one or more of the barrier members 334 are attached to the first surface 335a of the conductive layer 332 and/or to the second surface 221bb of the bond pad 225. In other embodiments, end portions of the barrier members 334 are positioned adjacent to the bond pad 225 and the conductive layer 332 but not connected thereto. Referring to FIG. 3B, the barrier members 334 can form rings or coils that are concentrically arranged with respect to each other and the footprint of the conductive pillar 106. In the illustrated embodiment, (i) the first and second barrier members 334a, b are positioned outside of the footprint of the conductive pillar 106 and adjacent to one another, and (ii) the third and fourth barrier members 334c, d are positioned within the footprint of the conductive pillar 106 and adjacent to one another. That is, the first and second barrier members 334a, b can be positioned laterally outboard of the conductive pillar 106 while the third and fourth barrier members 334c, d can be positioned laterally inboard of the conductive pillar 106. As further shown in FIG. 3B, the first and second barrier members 334a, b can generally encircle or surround the footprint of the conductive pillar 106.

The barrier members 334 can be formed from materials that have a greater mechanical strength than the insulating material 224. In some embodiments, for example, the barrier members 334 comprise a metal material (e.g., tungsten). Moreover, the barrier members 334 can be formed as part of the BEOL fabrication process used to form the metallization structure 316. For example, after forming the conductive layer 332 and a layer of the insulating material 224 over the conductive layer 332, the layer of the insulating material 224 can be etched to form vias and the vias can be filled with tungsten and/or another suitable material to form the barrier members 334. More specifically, in some embodiments, the tungsten and/or other material can be plated onto the conductive layer 332 in the vias using a suitable electroplating or electroless-plating process, as is well known in the art. In some embodiments, the barrier members 334 have a rectilinear (e.g., rectangular) cross-sectional shape while, in other embodiments, the barrier members 334 can have other suitable cross-sectional shapes (e.g., circular, polygonal, irregular, etc.).

In operation, the structure 330 is configured to inhibit, block, and/or retard propagation of stress-induced cracks through the insulating material 224 and/or the conductive layers 222. As described in detail above with reference to FIGS. 2A and 2B, any cracks are expected to (i) originate in the insulating material 224 beneath the bond pad 225 proximate to the footprint (e.g., beneath the perimeter of) the conductive pillar 106, and (ii) propagate laterally across the footprint of the conductive pillar 106. Accordingly, the barrier members 334—which are formed of a material that is mechanically stronger than the insulating material 224—are positioned to block cracks from propagating a great distance laterally through the insulating material 224, thereby inhibiting or even preventing mechanical and/or electrical failure of the interconnect 104 and/or the metallization structure 316. For example, a crack originating at the perimeter of the footprint of the conductive pillar 106 and propagating laterally inward will be blocked, deflected, etc., by the third barrier member 334c. In such embodiments, the fourth conductive member 334d can provide additional reinforcement in the event the crack manages to propagate through or break through the third barrier member 334c. Similarly, a crack originating at the perimeter of the footprint of the conductive pillar 106 and propagating laterally outward will be blocked, deflected, etc., by the second barrier member 334b. Moreover, the conductive layer 332 can inhibit cracks from propagating vertically (e.g., in a direction toward the semiconductor substrate 112) through the insulating material 224 and/or through the first and second conductive layers 222a, b. Accordingly, the metallization structure 316 is expected to increase the mechanical strength of the semiconductor die 110 as compared to conventional metallization structures (e.g., FIGS. 2A and 2B) and thereby reduce the likelihood of mechanical and/or electrical failure due to stress-induced cracking.

Figure 4:
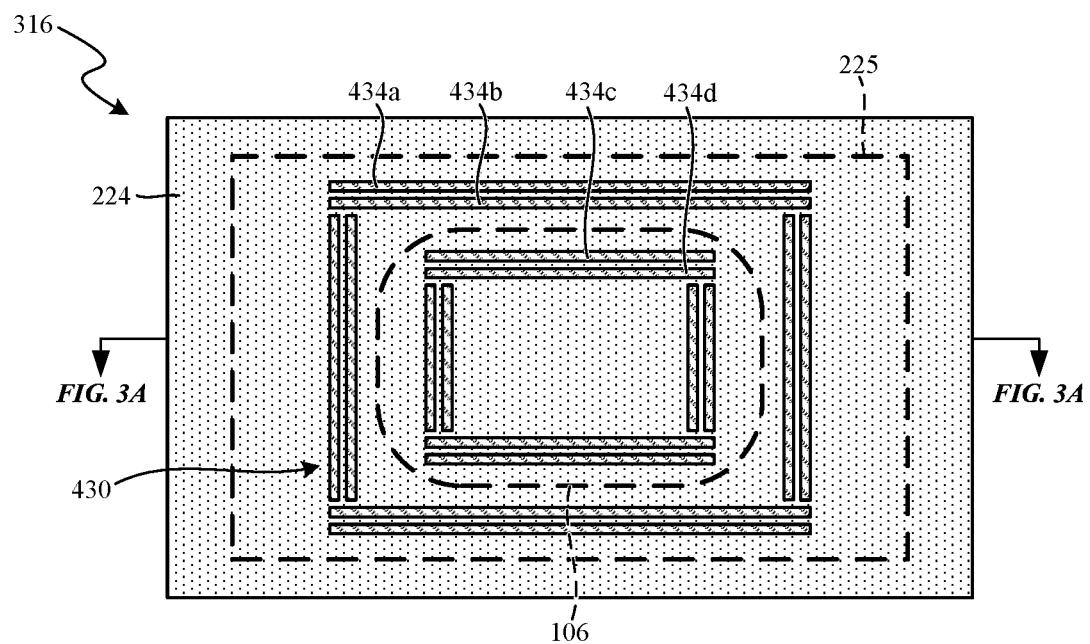
FIGS. 4-6 are bottom cross-sectional views of the portion of the semiconductor package shown in FIG. 3A and having metallization structures configured in accordance with other embodiments of the present technology.
Figure 5:
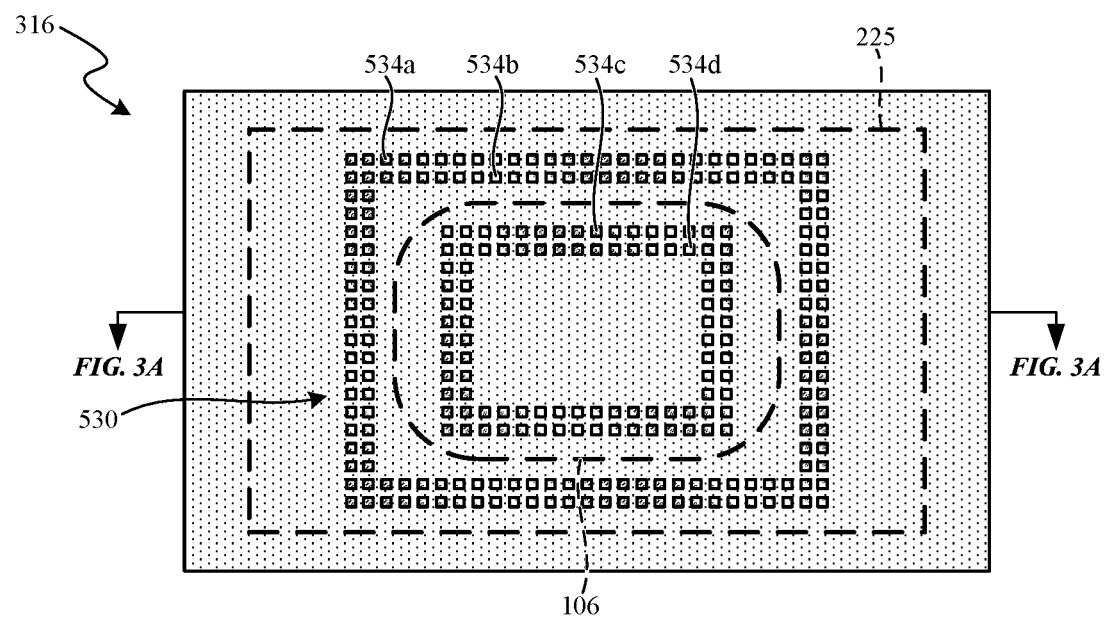
Figure 6:
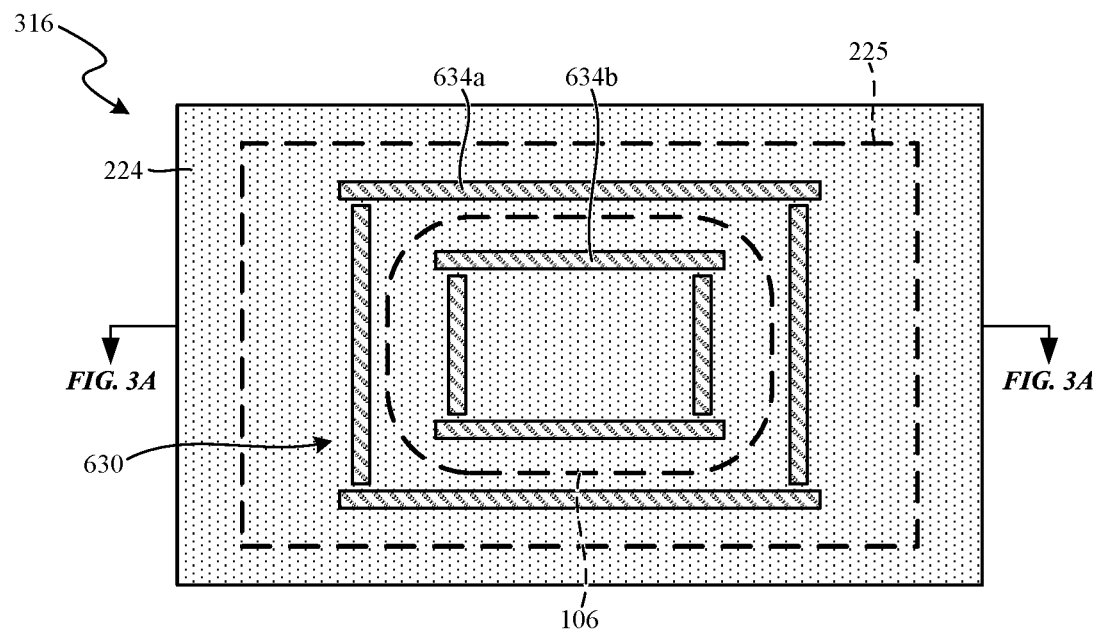

In other embodiments, the structure 330 can include more or fewer of the barrier members 334. In some embodiments, for example, adding additional ones of the barrier members 334 can further increase the mechanical strength of the metallization structure 316 and thus further inhibit crack propagation through the insulating material 224. In some embodiments, the structure 330 can include more and/or thicker barrier members 334 or other metal structures along a direction of expected crack propagation (e.g., in a direction between the first and second side portions 228a, b of the conductive pillar 106) than along another direction (e.g., between the third and fourth side 228c, d portions 228c, d of the conductive pillar 106). In yet other embodiments, crack-inhibiting structures in accordance with the present technology can include barrier members having other shapes, arrangements, configurations, etc. FIGS. 4-6, for example, are enlarged, bottom cross-sectional views of the portion of the package 100 shown in FIG. 3A and having crack-inhibiting structures in accordance with other embodiments of the present technology.

Referring to FIG. 4, the metallization structure 316 includes a crack-inhibiting structure 430 having a plurality of barrier members 434 (individually labeled as first through fourth barrier members 434a-434d). In the illustrated embodiment, the barrier members 434 each comprise a plurality of generally linear, elongate segments that together form rings or coils that are concentrically aligned with the footprint of the conductive pillar 106. In some embodiments, individual ones of the barrier members 434 can comprise more or fewer than the four illustrated segments. Referring to FIG. 5, the metallization structure 316 includes a crack-inhibiting structure 530 having a plurality of barrier members 534 (individually labeled as first through fourth barrier members 534a-534d). In the illustrated embodiment, the barrier members 534 each comprise a plurality of columns arranged in rings or coils that are concentrically aligned with the footprint of the conductive pillar 106. In some embodiments, the barrier members 434 and/or 534 can be relatively easier to manufacture than the barrier members 334 because, for example, the linear segments and/or columns need not be connected and can be discretely formed.

Referring to FIG. 6, the metallization structure 316 includes a crack-inhibiting structure 630 having a first barrier member 634a and a second barrier member 634b that are concentrically aligned with the footprint of the conductive pillar 106. In the illustrated embodiment, the first barrier member 634a includes a plurality of generally linear segments that together form a ring- or coil-like shape outside the footprint of the conductive pillar 106. Likewise, the second barrier member 634b includes a plurality of generally linear segments that together form a ring- or coil-like shape inside the footprint of the conductive pillar 106.

From the foregoing, it will be appreciated that specific embodiments of the present technology have been described herein for purposes of illustration, but that various modifications may be made without deviating from the scope of the present technology. For example, in particular embodiments, the details of the crack-inhibiting structures may be different than those shown in the foregoing Figures. In some embodiments, the various embodiments may be combined to, for example, include combinations of barrier members including one or more linear segments, integral rings, columns, etc., that are formed in an insulating material beneath a bond pad. Moreover, barrier members can have various spacings and arrangements relative to a footprint of a conductive column or other conductive feature attached to the bond pad.

The metallization structures of the present technology are expected to have a greater mechanical strength as compared to conventional metallization structures (e.g., FIGS. 2A and 2B) that include a weak dielectric layer beneath bond pads. The disclosed metallization structures can therefore reduce the likelihood of mechanical and/or electrical failure due to stress-induced cracking. Thus, the metallization structures of the present technology are expected to reduce yield loss during manufacturing of semiconductor packages (e.g., after a TCB bonding step, as a result of thermal cycling and/or thermal shock during package reliability tests, etc.) and to increase the reliability of semiconductor packages during operation (e.g., during power cycling during end-customer use). The metallization structures of the present technology are also expected to increase package performance by enabling the use of less mechanically strong dielectric materials (e.g., low-κ dielectric materials).

Figure 7:
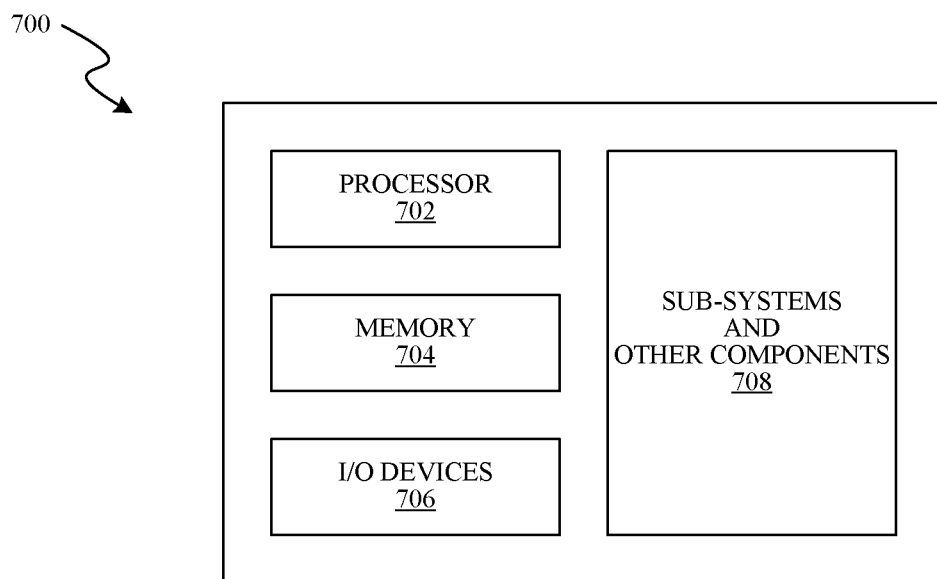
FIG. 7 is a schematic view of a system that includes a semiconductor device or package configured in accordance with embodiments of the present technology.

Any one of the semiconductor devices and/or packages having the features described above with reference to FIGS. 1A and 3A-6 can be incorporated into any of a myriad of larger and/or more complex systems, a representative example of which is system 700 shown schematically in FIG. 7. The system 700 can include a processor 702, a memory 704 (e.g., SRAM, DRAM, flash, and/or other memory devices), input/output devices 706, and/or other subsystems or components 708. The semiconductor dies and/or packages described above with reference to FIGS. 1A and 3A-6 can be included in any of the elements shown in FIG. 7. The resulting system 700 can be configured to perform any of a wide variety of suitable computing, processing, storage, sensing, imaging, and/or other functions. Accordingly, representative examples of the system 700 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 700 include lights, cameras, vehicles, etc. With regard to these and other example, the system 700 can be housed in a single unit or distributed over multiple interconnected units, e.g., through a communication network. The components of the system 700 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a substrate including circuit elements; and
   a metallization structure over the substrate, wherein the metallization structure includes—
   an insulating material;
   a bond pad exposed from the insulating material and electrically coupled to at least one of the circuit elements; and
   a crack-inhibiting structure positioned beneath the bond pad between the bond pad and the substrate, wherein the crack-inhibiting structure includes (a) a metal layer extending generally parallel to the bond pad and (b) a barrier member extending between the metal layer and the bond pad, and wherein the bond pad is electrically coupled to the at least one of the circuit elements via an electrical path that does not include the crack-inhibiting structure.

2. The semiconductor device of claim 1 wherein the crack-inhibiting structure is not electrically coupled to any of the circuit elements.

3. The semiconductor device of claim 1 wherein the barrier member is a first barrier member that forms a first ring, and wherein the crack-inhibiting structure further includes a second barrier member that forms a second ring that is concentric with the first ring.

4. The semiconductor device of claim 3 wherein—
   the bond pad is configured to be attached to a conductive pillar,
   when the bond pad is attached to the conductive pillar, the first ring is positioned outside a footprint of the conductive pillar, and
   when the bond pad is attached to the conductive pillar, the second ring is positioned inside a footprint of the conductive pillar.

5. The semiconductor device of claim 4, further comprising the conductive pillar.

6. The semiconductor device of claim 1 wherein—
   the barrier member is a first barrier member,
   the crack-inhibiting structure further includes a second barrier member,
   the bond pad is configured to be attached to a conductive pillar,
   when the bond pad is attached to the conductive pillar, the first barrier member is positioned entirely outside a footprint of the conductive pillar, and
   when the bond pad is attached to the conductive pillar, the second barrier member is positioned entirely inside a footprint of the conductive pillar.

7. The semiconductor device of claim 1 wherein the barrier member comprises a plurality of columns extending between the metal layer and the bond pad.

8. The semiconductor device of claim 1 wherein the barrier member comprises a plurality of elongate segments extending between the metal layer and the bond pad.

9. The semiconductor device of claim 1 wherein the barrier member comprises tungsten.

10. The semiconductor device of claim 9 wherein the metal layer comprises a material selected from the group consisting of copper and aluminum.

11. The semiconductor device of claim 1 wherein the insulating material comprises a low-κ dielectric material.

12. The semiconductor device of claim 1 wherein the bond pad is not electrically coupled to the at least one circuit element via a conductive structure that extends vertically beneath the bond pad between the bond pad and the substrate.

13. A semiconductor package, comprising:
    a package substrate;
    a semiconductor die including a metallization structure formed over a semiconductor substrate, wherein the metallization structure includes (a) bond pads electrically coupled to the semiconductor substrate and (b) crack-inhibiting structures positioned beneath the bond pads between the bond pads and the semiconductor substrate; and
    conductive interconnects electrically coupling the package substrate to corresponding ones of the bond pads, wherein—
    individual ones of the crack-inhibiting features include a first barrier member and a second barrier member,
    the first barrier member is positioned laterally outside of a footprint of a corresponding one of the conductive interconnects,
    the second barrier member is positioned laterally inside of the footprint of the corresponding one of the conductive interconnects; and
    the bond pads are electrically coupled to the semiconductor substrate via electrical paths that do not include the crack-inhibiting structures.

14. The semiconductor package of claim 13 wherein the crack-inhibiting structures are not electrically coupled to the semiconductor substrate.

15. The semiconductor package of claim 13 wherein the first barrier member generally surrounds the footprint of the corresponding one of the conductive interconnects.

16. The semiconductor package of claim 13 wherein the first and second barrier members are concentrically arranged.

17. A semiconductor device, comprising:
    a semiconductor substrate;
    a metallization structure over the semiconductor substrate, wherein the metallization structure includes—
    an insulating material;
    a bond pad exposed from the insulating material and electrically coupled to the semiconductor substrate; and
    a crack-inhibiting structure positioned beneath the bond pad between the bond pad and the substrate, wherein the crack-inhibiting structure includes a barrier member extending vertically from the bond pad toward the semiconductor substrate, and wherein the bond pad is electrically coupled to the semiconductor substrate via an electrical path that does not include the crack-inhibiting structure.

18. The semiconductor device of claim 17 wherein the bond pad is not electrically coupled to the semiconductor substrate via a conductive structure that extends beneath the bond pad between the bond pad and the substrate.

19. The semiconductor device of claim 17 wherein the insulating material comprises a low-κ dielectric material, and wherein the barrier member comprises tungsten.

20. The semiconductor device of claim 17 wherein the crack-inhibiting structure further comprises a metal layer extending laterally between the substrate and the bond pad, and wherein the barrier member is attached to the bond pad and the metal layer.

21. The semiconductor device of claim 17 wherein the barrier member forms a continuous ring.

22. The semiconductor device of claim 17 wherein the barrier member includes a plurality of discrete segments arranged in a ring-like pattern.

\* \* \* \* \*